United States Patent [19]

Hong et al.

[11] Patent Number: 5,625,213
[45] Date of Patent: Apr. 29, 1997

[54] TOP FLOATING-GATE FLASH EEPROM STRUCTURE

[75] Inventors: Gary Hong; Chen-Chiu Hsue, both of Hsin-Chu, Taiwan

[73] Assignee: United Microelectronics Corporation, Hsin-Chu, Taiwan

[21] Appl. No.: 500,104

[22] Filed: Jul. 10, 1995

Related U.S. Application Data

[62] Division of Ser. No. 275,269, Jul. 15, 1994, Pat. No. 5,457,061.

[51] Int. Cl.$^6$ ................................. H01L 29/788
[52] U.S. Cl. ................ 257/321; 257/316; 257/322
[58] Field of Search ........................ 257/316, 321, 257/315, 317, 322

[56] References Cited

U.S. PATENT DOCUMENTS

| | | | |
|---|---|---|---|
| 4,336,603 | 6/1982 | Kotecha et al. | 257/321 |
| 4,417,264 | 11/1983 | Angle | 365/185.14 |
| 4,868,629 | 9/1989 | Eitan | 365/185 |
| 5,293,328 | 3/1994 | Amin et al. | 257/315 |

FOREIGN PATENT DOCUMENTS 58-121680  7/1983  Japan ...................... 257/321

*Primary Examiner*—Sara W. Crane
*Attorney, Agent, or Firm*—William H. Wright

[57] ABSTRACT

A method for forming, and a resultant structure of, a top floating gate FLASH EEPROM cell are described. There is a first insulating structure over a silicon substrate, whereby the first insulating structure is a gate oxide. A first conductive structure is formed over the first insulating structure, whereby the first conductive structure is a control gate. There is a first insulating layer over the surfaces of the first conductive structure, whereby the first insulating layer is an interpoly dielectric. There is a second conductive structure formed over the first insulating layer and over a portion of the silicon substrate adjacent to the first insulating structure, whereby the second conductive structure is a floating gate. A second insulating layer is formed between the silicon substrate and the second conductive structure, whereby the second insulating layer is a tunnel oxide. Active regions in the silicon substrate, implanted with a conductivity-imparting dopant, are formed under the second insulating layer but are horizontally a distance from the first insulating structure.

9 Claims, 4 Drawing Sheets

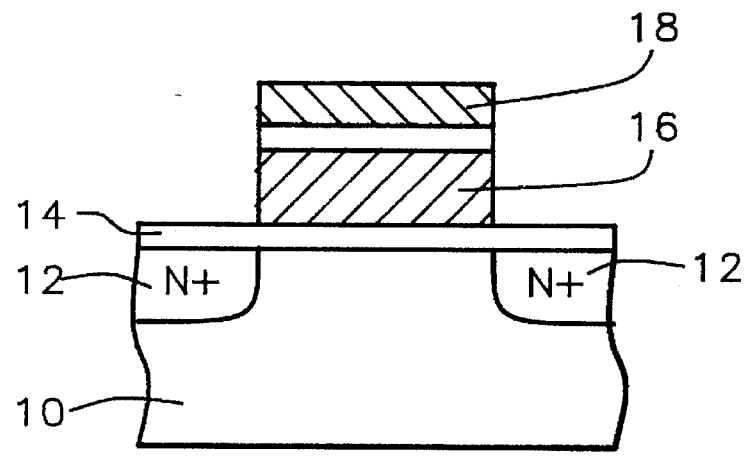
*FIG. 1 - Prior Art*
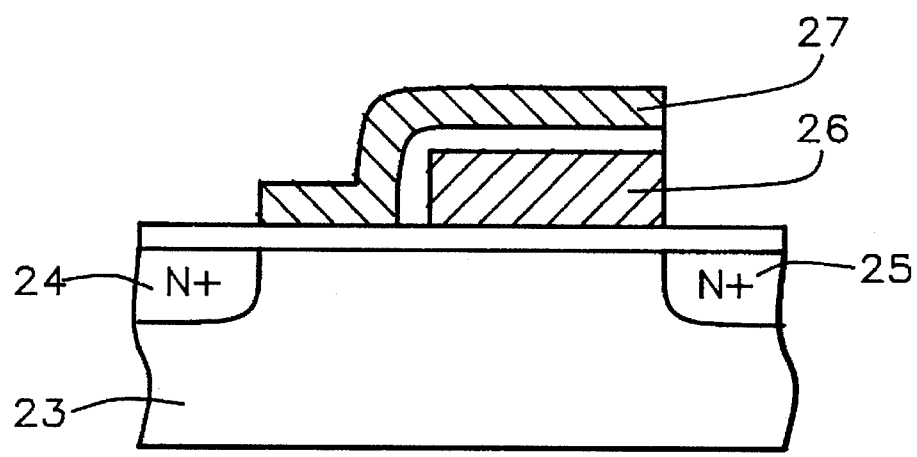
*FIG. 2 - Prior Art*

TOP FLOATING-GATE FLASH EEPROM STRUCTURE

This is a division of application Ser. No. 08/275,269, filed Jul. 15, 1994 and now U.S. Pat. No. 5,457,061.

BACKGROUND OF THE INVENTION

1. Field of the Invention

This invention relates to a Read Only Memory (ROM) semiconductor device, and more particularly to a structure and method of manufacturing a top floating gate flash EEPROM (Electrically Erasable Programmable Read Only Memory).

2. Description of the Related Art

ROM devices are well known and widely used in the computer technology. In general, a ROM device consists of an array of MOSFETs (Metal Oxide Semiconductor Field Effect Transistor) arranged in columns and rows where selected MOSFETS are rendered permanently conductive, or non-conductive, depending on the type of transistor. The ability to set the conductive state of each MOSFET provides a means for storing binary information, and is done typically during a manufacturing process. In a ROM device, this information is non-volatile, i.e., it is maintained even when power is removed from the circuit.

EPROM devices differ from ROMs in their ability to be programmed and erased by a user, after the manufacturing process is complete. They offer advantages such as a small single-cell structure, made of a single MOS transistor with a double-polysilicon gate, and thus high density. Programming is typically accomplished by channel hot-electron injection, outside of the circuit in which the EPROM is used, and erasing by exposure to ultraviolet light, or other means. These somewhat cumbersome techniques explain the popularity of EEPROMs (Electrically Erasable Programmable Read Only Memory), which can be erased and programmed while in-circuit, using Fowler-Nordheim tunneling. However, EEPROMs have a large cell size and require two transistors per cell.

An EEPROM uses a floating gate structure in the MOSFET cell to provide programmability. The floating, or unconnected, gate provides a conductive surface isolated from the source and drain regions of the MOSFET by a thin gate oxide. A second conductive gate, called the control gate, is adjacent to but isolated from the floating gate. The threshold voltage characteristics of the MOSFET cell is controlled by the amount of charge on the floating gate. The amount of charge is set to one of two levels, to indicate whether the cell has been programmed "on" or "off".

The memory cell's state is "read" by applying appropriate voltages to the MOSFET source and drain, and to the control gate, and then sensing the amount of current flow through the transistor. The desired memory cell is selected by choosing the source and drain lines in the column where the cell is located, and applying the control gate voltage to the control gates in the row of the cell being addressed.

The memory cell's programmable state may be erased by removing charge from the floating gate. A fairly recent technology is "Flash" memories, in which the entire array of memory cells, or a significant subset thereof, is erased simultaneously. A conventional Flash memory cell is shown in FIG. 1, in which a control gate 18 has been formed directly over floating gate 16, which electrical charge is applied or removed through tunnel oxide 14 by channel-hot-electron or Fowler-Nordheim tunneling by way of source/drain regions 12, in a substrate 10.

A known problem with the EEPROM is that of "over-erasing", in which positive charge remains on the floating gate after an erase. One solution is the split-gate structure of FIG. 2, which solves the over-erase problem but at the expense of a larger cell size. Source 24 and drain 25 regions are self-aligned in a substrate 23 with the edges of floating-gate 26 and isolation gate 27, respectively. An example is shown in U.S. Pat. No. 4,868,629 (Eitan). Eitan teaches the use of a photoresist pattern to cover part of the floating gate area and the channel region of the "isolation transistor" (which is connected in series with the floating-gate transistor), during source/drain implant.

A problem with this split-gate Flash cell structure is that all program and erase operations take place through the drain, leading to reliability problems and the charge trapping effect. Only the drain junction is underneath the floating gate, and therefore program and erase operations can only be performed through the drain junction. Usually the erase operation causes electron trapping in the tunnel oxide near the drain, which results in less electric field for the program operation, and thus reliability degradation. If the program and erase operations were performed separately, one each through the source and drain areas, the program/erase (endurance) cycles would be improved.

SUMMARY OF THE INVENTION

It is therefore an object of the invention to provide a top floating gate FLASH EEPROM cell with improved reliability.

It is a further object of the invention to provide a a method of manufacturing a top floating gate FLASH EEPROM cell.

These objects are achieved by a top floating gate Flash EEPROM, in which there is a first insulating structure over a silicon substrate, whereby the first insulating structure is a gate oxide. A first conductive structure is over the first insulating structure, whereby the first conductive structure is a control gate. There is a first insulating layer over vertical and horizontal surfaces of the first conductive structure and over vertical surfaces of the first insulating structure, whereby the first insulating layer is an interpoly dielectric. There is a second conductive structure over the first insulating layer and over a portion of the silicon substrate adjacent to the first insulating structure, whereby the second conductive structure is a floating gate. A second insulating layer is between the silicon substrate and the second conductive structure, whereby the second insulating layer is a tunnel oxide. Active regions in the silicon substrate, implanted with a conductivity-imparting dopant, are under the second insulating layer but are horizontally a distance from the first insulating structure.

These objects are further achieved by a method of manufacturing a top floating gate flash EEPROM cell, in which a first insulating layer is formed over a silicon substrate. A first conductive layer is formed over the first insulating layer. A second insulating layer is formed over the first conductive layer. The second insulating layer and the first conductive layer are patterned to form a conductive line. A third insulating layer is formed on the vertical surfaces of the conductive line. The first insulating layer is removed in the region not masked by the conductive line. A fourth insulating layer is formed in the region not masked by the conductive line. A second conductive layer is formed over the conductive line, the third insulating layer and the fourth insulating layer. The second conductive layer is patterned to form a floating gate over vertical and horizontal surfaces of the conductive line, and over a portion of the fourth insulating layer adjacent to the conductive line. Active regions are formed in the silicon substrate in the area not masked by the floating gate.

BRIEF DESCRIPTION OF THE DRAWINGS

FIGS. 1 and 2 are cross-sectional representations of two prior art structures for Flash EEPROMs.

FIG. 6 is taken along line 6—6 of FIG. 7.

DESCRIPTION OF THE PREFERRED EMBODIMENTS

Figure 3:
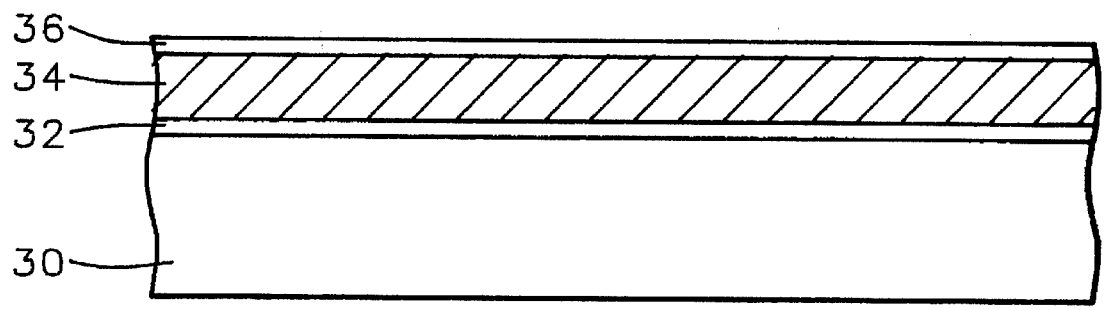
FIGS. 3 to 6 are cross-sectional representations of the invention for a top floating gate Flash EEPROM, where

Referring now to the drawings, more particularly to FIGS. 3 through 8, there is illustrated a method and resulting structure for the novel process for producing a top floating gate EEPROM. Referring more particularly to FIG. 3, there is illustrated a silicon substrate 30 which has been p-doped with the dopant concentration being between about 1 E 14 and 5 E 15 atoms/cm.$^3$. An oxide layer 32 is formed to provide a gate oxide, by thermal oxidation at a temperature of between about 800° and 1000° C. for between about 10 and 30 minutes, in an atmosphere of $O_2/N_2$ (oxygen/ nitrogen). This results in the formation of a gate oxide with a thickness of between about 150 and 400 Angstroms.

A deposition of polycrystalline silicon 34, or polysilicon, is now performed to a thickness of between about 1000 and 5000 Angstroms, by LPCVD (Low Pressure Chemical Vapor Deposition). The resistivity of the polysilicon layer is reduced by doping with phosphorus P31, or arsenic AS75, at a concentration of between about 1 E 14 and 5 E 15 atoms/cm.$^2$ and at an energy of between about 30 and 60 KeV.

An interpoly oxide 36 is now formed on polysilicon layer 34. This may be a single oxide layer but is preferably ONO—a three-layer sandwich structure of silicon oxide ($SiO_2$), silicon nitride ($Si_3N_4$) and silicon oxide ($SiO_2$). The first $SiO_2$ layer is formed by thermal oxidation to a thickness of between about 60 and 150 Angstroms. The $Si_3N_4$ layer is deposited by LPCVD to a thickness of between about 80 and 200 Angstroms. The final $SiO_2$ layer is formed by thermal oxidation, or CVD, to a thickness of between about 20 and 80 Angstroms. The total interpoly oxide thickness is between about 120 and 300 Angstroms.

Figure 4:
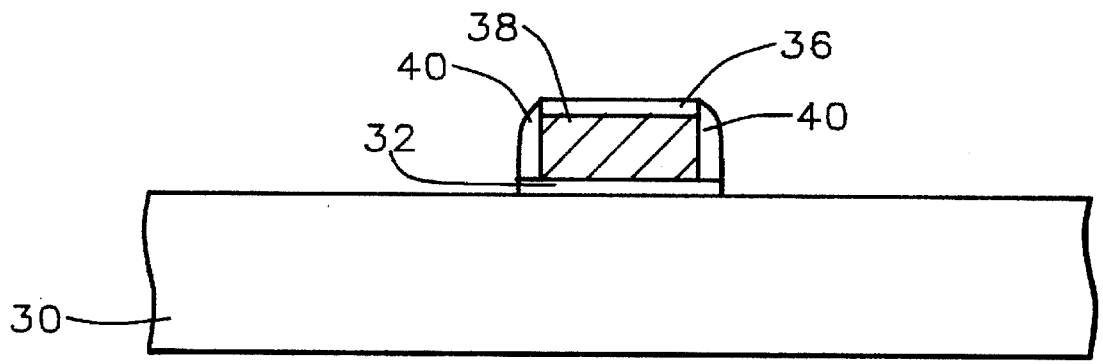
Figure 5:
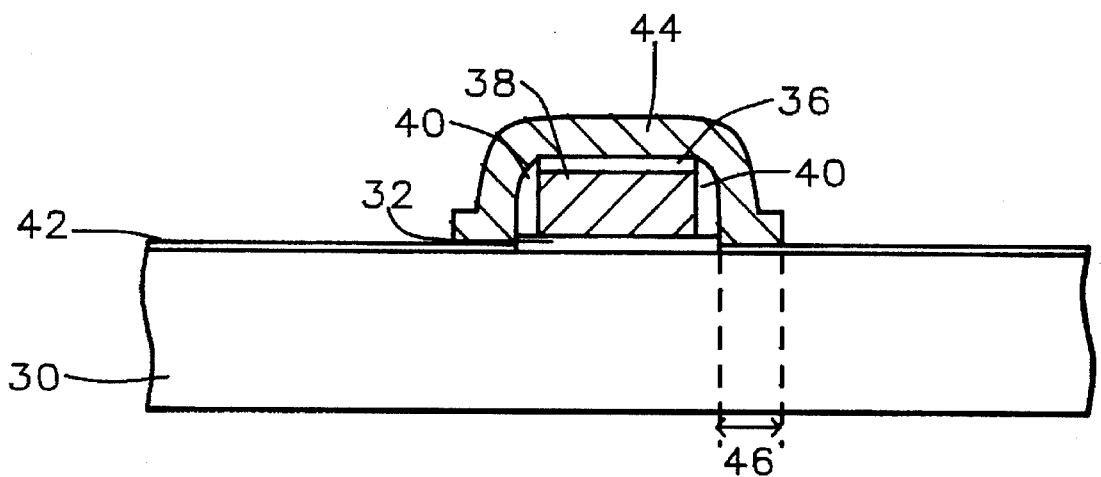

Referring now to FIG. 4, the first polysilicon layer 34 is patterned, by conventional lithography and etching, to form word lines 38 for the Flash EEPROM. Word lines are formed as parallel conductive strips (running into and out of the cross-sectional drawing of FIG. 4), and will connect a column of memory cells, with the word line acting as a control gate at each memory cell location. This is in contrast to the prior art Flash EEPROM structures of FIGS. 1 and 2 in which the control gate is formed over the floating gate. Etching of the ONO layer 36 and polysilicon 34 is accomplished by dry etching. The gate oxide is not etched.

To form an interpoly dielectric on the vertical surfaces of the word lines 38, a single insulating layer 40 could be formed, as shown in FIG. 4, but it is preferred to form an oxide/nitride dielectric. A thin oxidation is performed, thermally at a temperature of between about 800° and 1000° C. and for between about 10 and 50 minutes, to form an $SiO_2$ layer with a thickness of between about 60 and 200 Angstroms. This is followed by a nitride deposition and etch, in which $Si_3N_4$ is deposited by LPCVD, to a thickness of between about 100 and 300 Angstroms, and etched anisotropically to leave $Si_3N_4$ only on the vertical surfaces of the word lines.

Also as seen in FIG. 4, the gate oxide is etched, using the word line 38 and spacers 40 as a mask, by etching in buffered hydrofluoric acid for between about 1 and 3 minutes, so that the gate oxide remains only under the word lines 38.

During the gate oxide etch, the top oxide layer of ONO layer 36 is etched away. However, with reference now to FIG. 5, the ONO top oxide is re-grown at the same time as the formation of a thin oxide 42, by thermally oxidizing at a temperature of between about 800° and 1000° C. for between about 10 and 50 minutes, in an atmosphere of $O_2/N_2$ or $O_2/N_2/H_2$. A thin oxide is formed at the same time on the surface of layer 40. The thermal oxidation results in a tunnel oxide layer 42 with a thickness of between about 60 and 120 Angstroms, which will be used as the tunnel oxide for the Flash EEPROM memory cell program, read and erase operations.

A conformal deposition of polysilicon is now performed to a thickness of between about 1000 and 5000 Angstroms, by LPCVD. The resistivity of the polysilicon layer is reduced by ion implantation of arsenic or phosphorus, or by in-situ doping with phosphorus oxychloride ($POCl_3$). The floating gate 44 of the Flash cell is then formed by conventional lithography and etching of the polysilicon. The portion of the floating gate in contact with the tunnel oxide has a length 46 of between about 0.2 and 0.8 micrometers.

Figure 6:
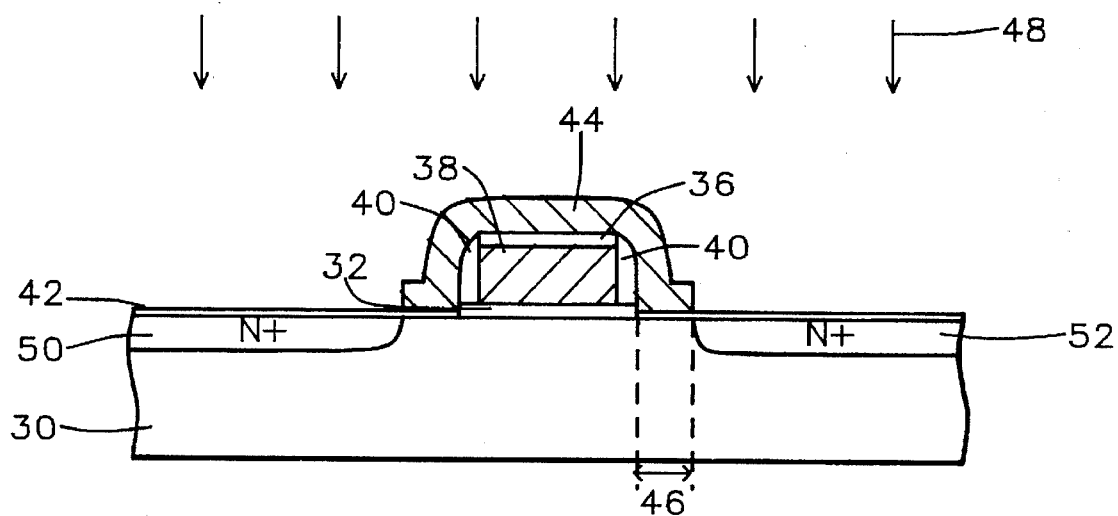

Referring now to FIG. 6, the memory cell source regions 50 and drain regions 52 are formed by ion implantation 48 of arsenic AS75 at an energy of between about 40 and 100 KeV, and a dosage of between about 1 E 15 and 8 E 15 atoms/cm.$^2$. Completion of the Flash EEPROM device now proceeds as is well known in the art (not shown). A layer of borophosphosilicate glass (BPSG) is deposited and reflowed to planarize its top surface, contacts are formed, and metallization and passivation steps are carried out. During BPSG reflow, the ion-implanted dopant in the N+ regions 50 and 52 would be driven in.

Figure 7:
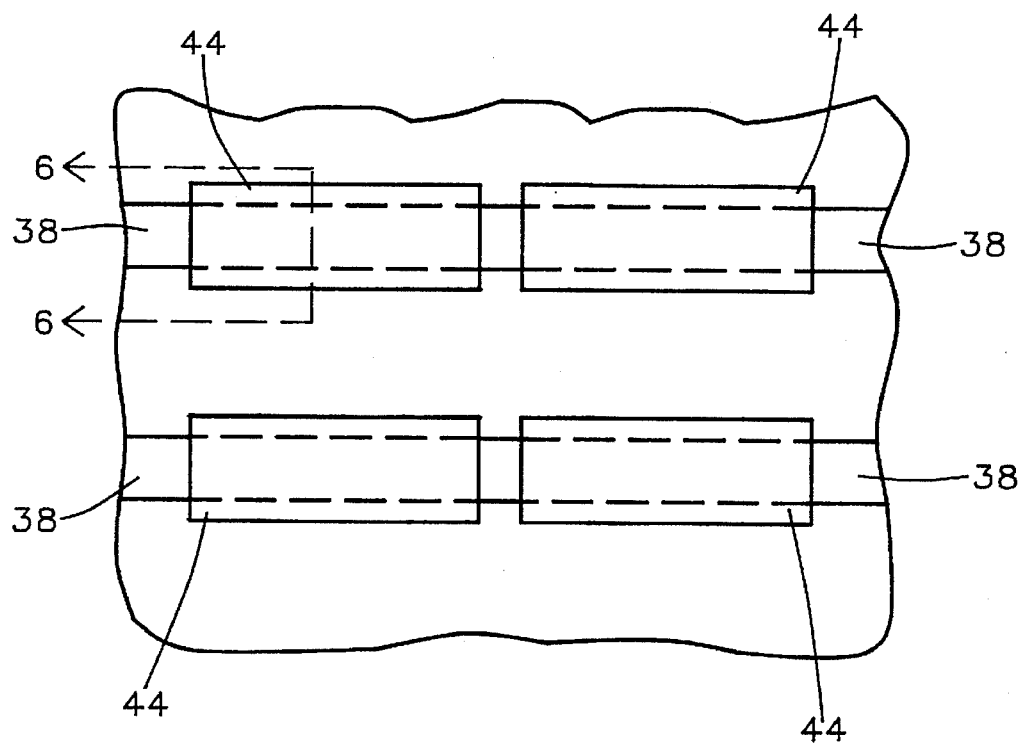
FIG. 7 is a top view of the invention for a top floating gate Flash EEPROM.
Figure 8:
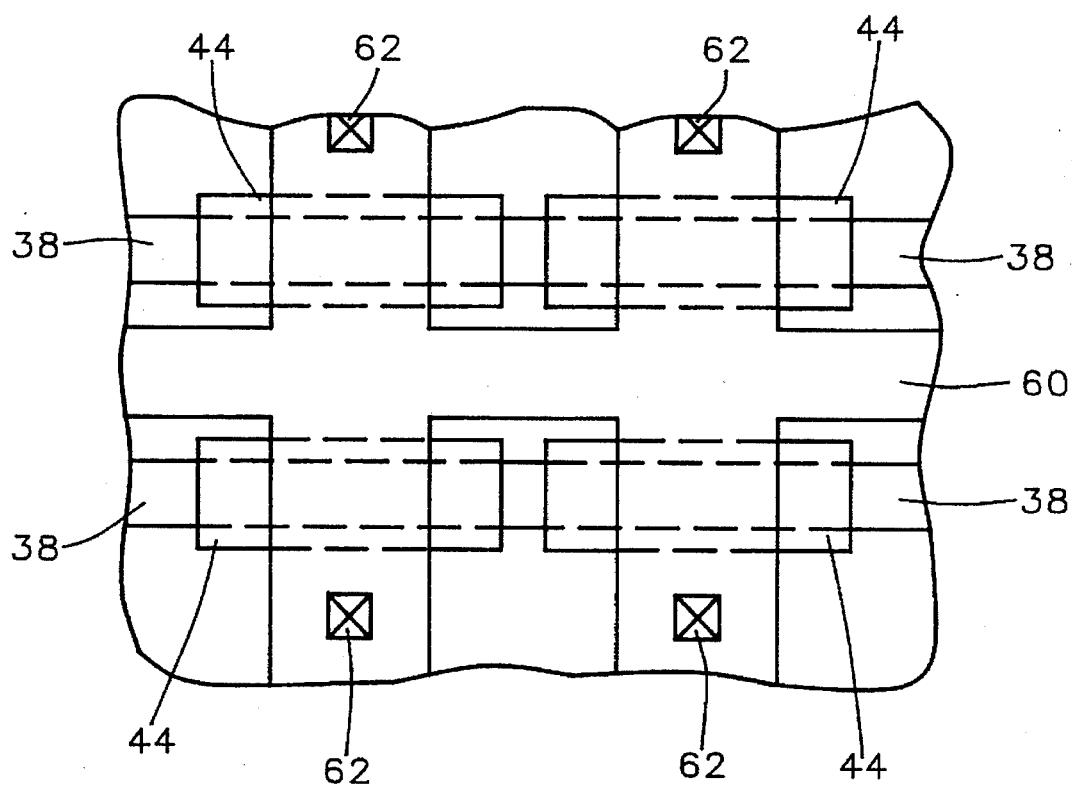
FIG. 8 is a top view of the invention for a top floating gate Flash EEPROM, in which metallization and contacts are also shown.

FIGS. 7 and 8 are top views of a portion of an array of the top floating-gate Flash EEPROM cells of the invention. The FIG. 6 cross-section is taken along view 6—6 of FIG. 7, before the metallization 60 in FIG. 8 has been added. Shown in FIGS. 7 and 8 are the first polysilicon word lines 38, and the second polysilicon floating gates 44. Metallization 60 and contacts 62 are also shown.

Operation of the EPROM is indicated in Table I below, in which the voltages to be applied at the control gate, drain and source, respectively, are shown.

TABLE I

| Operation | Control gate (W/L) | Drain | Source |
| --- | --- | --- | --- |
| Program | $V_{PP}$ | 0 | floating |
| Erase | 0 | floating | $V_{PP}$ |
| Read | 3 V | 1 V | 0 |

$V_{PP}$ = 10 to 20 volts

To program the EPROM, that is, to set the charge on the floating gate to an "on" level a voltage level of 10 to 20 V (volts), noted as $V_{PP}$, is applied to the word line/control gate of the memory cell that is desired to be programmed. A level of 0 volts is applied to the memory cell drain, and the source is left to float, that is, with no voltage applied.

To erase the cell contents, a level of 0 V is applied to the word line/control gate, the drain is left to float, and $V_{pp}$ is applied to the source. For a read operation, voltages of 1 V are applied at the word line/control gate and at the drain, and 0 V at the source.

It is seen that the source and drain are left floating during program and erase operations, respectively, which leads to the improved reliability of the Flash EEPROM of the invention, over those prior art split-gate structures in which all program and erase operations are done through the drain junction.

While the invention has been particularly shown and described with reference to the preferred embodiments thereof, it will be understood by those skilled in the art that various changes in form and details may be made without departing from the spirit and scope of the invention.

What is claimed is:

1. A Flash EEPROM with an array of top floating gate memory cells, comprising:

a plurality of parallel, conductive lines formed over a silicon substrate, whereby said parallel, conductive lines are word lines and act as a control gate at said memory cells;

a first insulating layer between said parallel, conductive lines and said silicon substrate, whereby said first insulating layer is a gate oxide;

a first conductive structure over vertical and horizontal surfaces of said word lines at said memory cells, and extending over a portion of said silicon substrate adjacent to said word lines, whereby said first conductive structure is a floating gate;

a second insulating layer between said silicon substrate and said floating gate, whereby said second insulating layer is a tunnel oxide;

a third insulating layer over the surfaces of said word lines, extending between said word lines and said floating gate;

source/drain regions in said silicon substrate, implanted with a conductivity-imparting dopant, under said second insulating layer but horizontally a distance from said first insulating layer;

a fourth insulating layer over said memory cells, and over said silicon substrate between said memory cells;

an interconnecting metallization system over said fourth insulating layer, to connect said word lines and said source/drain regions to peripheral circuits of said array; and a means to provide voltage to said word lines and said source/drain regions, wherein said providing means are used to program said memory cells by applying a voltage of between about 10 and 20 volts to said word line, a voltage of 0 volts to a drain region, and a floating voltage to a source region.

2. The flash EEPROM of claim 1, wherein said source/drain regions are horizontally a distance from said first insulating layer of between about 0.2 and 0.8 micrometers.

3. The device of claim 1 wherein said providing means are used to erase said memory cells by applying a voltage of 0 volts to said word line, a floating voltage to said drain region, and a voltage of between about 10 and 20 volts to said source region.

4. The device of claim 1 wherein said providing means are used to read said memory cells by applying a voltage of 3 volts to said word line, a voltage of 1 volt to said drain region, and 0 volts to said source region.

5. The device of claim 4 further comprising a means to detect current flow through said memory cells during said read operation.

6. The device of claim 5 wherein said detecting means are used to determine if said memory cell is off or on.

7. A flash EEPROM with an array of top floating gate memory cells, comprising:

a plurality of parallel, conductive lines formed over a silicon substrate, whereby said parallel, conductive lines are word lines and act as control gates at said memory cells;

a first insulating layer between said parallel, conductive lines and said silicon substrate, whereby said first insulating layer is a gate oxide;

a first conductive structure over vertical and horizontal surfaces of said word lines at said memory cells, and extending to first edges and second edges, the first edges at a first distance away from said word lines and the second edges at a second distance along a second direction away from said word lines, whereby said first conductive structure is a floating gate and whereby the first and second distances are equal;

a second insulating layer between said silicon substrate and said floating gate, whereby said second insulating layer is a tunnel oxide;

a third insulating layer over the surfaces of said word lines, extending between said word lines and said floating gate; and source and drain regions in said silicon substrate, the source regions aligned to the first edges of the first conductive structures and the drain regions aligned to the second edges of the first conductive structures.

8. The flash memory of claim 7, further comprising a means to provide voltage to said word lines and said source and drain regions, said providing means to program said memory cells by applying a voltage of between about 10 and 20 volts to said word line, a voltage of 0 volts to a drain region, and a floating voltage to a source region.

9. A flash EEPROM comprising:

a plurality of parallel, conductive lines formed over a silicon substrate, whereby said parallel, conductive lines are word lines and act as control gates at flash memory cells;

a first insulating layer between a word line and said silicon substrate, whereby said first insulating layer is a gate oxide;

a first conductive structure over vertical and horizontal surfaces of said word line, and extending to a first edge and a second edge, the first edge at a first distance away from said word line and the second edge at a second distance along a second direction away from said word line, whereby said first conductive structure is a floating gate and whereby the first and second distances are equal;

a second insulating layer between said silicon substrate and said floating gate, whereby said second insulating layer is a tunnel oxide;

a third insulating layer over the surfaces of said word line, extending between said word line and said floating gate; and source and drain regions in said silicon substrate, the source region aligned to the first edge of the first conductive structure and the drain region aligned to the second edge of the first conductive structure.

\* \* \* \* \*